(12) United States Patent
Chang

(10) Patent No.: US 6,232,551 B1
(45) Date of Patent: May 15, 2001

(54) SUBSTRATE BOARD FOR SEMICONDUCTOR PACKAGE

(75) Inventor: Su Yuan Chang, Taoyuan Hsien (TW)

(73) Assignee: Subtron Technology Co., Ltd., Hsinchu (TW)

( * ) Notice: Subject to any disclaimer, the term of this patent is extended or adjusted under 35 U.S.C. 154(b) by 0 days.

(21) Appl. No.: 09/376,593

(22) Filed: Aug. 18, 1999

(51) Int. Cl.$^7$ .................................................. H01L 23/02
(52) U.S. Cl. ............................................................ 174/52.4
(58) Field of Search .................................... 174/260, 261, 174/262, 263, 264, 265, 52.4, 52.2, 52.3; 361/748, 783; 257/687; 29/854

(56) References Cited

U.S. PATENT DOCUMENTS

| | | | |
|---|---|---|---|
| 3,969,816 | * 7/1976 | Swengel, Sr. et al. | 29/879 |
| 4,865,875 | * 9/1989 | Kellerman | 427/96 |
| 5,025,114 | * 6/1991 | Braden | 174/52.4 |
| 5,480,048 | * 1/1996 | Kitamura et al. | 216/13 |
| 5,635,671 | * 6/1997 | Freyman et al. | 174/52.2 |
| 5,962,810 | * 10/1999 | Glenn | 174/52.2 |

\* cited by examiner

*Primary Examiner*—Adolf Deneke Berhane
(74) *Attorney, Agent, or Firm*—Jiawei Huang; J.C. Patents

(57) ABSTRACT

A substrate board structure formed by stacking a plurality of circuit layers and insulation layers on top of each other. Each circuit layer has a plurality of circuit lines and every circuit layer is separated from its neighbors by an insulation layer. The insulation layers further have a plurality of vias for connecting electrically with an electroplating bar layer. The interior surface of each via is electroplated with a metal film and the remaining space within the via is filled with a filler material. The substrate board further includes a central slot. The circuit layer on the surface of the substrate board has a plurality of first contact points and second contact points connected by circuit lines. The first contact points are close to the slot. Circuit lines that connect to the first contact points extend forward to reach the vias along the edge of the slot. Since the vias are formed on the boundary of the slot region, a portion of the metallic film within the vias is exposed.

14 Claims, 7 Drawing Sheets

SUBSTRATE BOARD FOR SEMICONDUCTOR PACKAGE

BACKGROUND OF THE INVENTION

1. Field of Invention

The present invention relates to a substrate board structure. More particularly, the present invention relates to the substrate board of a lead-on-chip (LOC) package.

2. Description of Related Art

As semiconductor manufacturing passes into the deep submicron scale, dimensions of each semiconductor device shrink. Hence, each integrated circuit has a higher operating speed. Due to the large-scale miniaturization of devices, volume of a semiconductor package can be reduced. To reduce the size of a semiconductor package, the semiconductor industry has developed several types of package structures such as the lead-on-chip (LOC) or the chip-on-lead (COL). The silicon chip of these package structures is stacked directly on top of the conductive wires of a lead frame or a substrate board. Hence, there is no need to set aside a specific area for mounting the silicon chip, thereby reducing the volume of the package. Other methods of decreasing package volume include the use of a laminated substrate carrier for supporting the silicon chip and the formation of an area array for solder balls.

FIG. 1 is a schematic top view showing a conventional LOC substrate board. The substrate board 10 consists of copper layers and an insulation layer 12 stacked together and having a slot 11 in the middle. After a hole-drilling operation and a copper layer patterning operation, circuit lines 14 are formed on the substrate board surface for subsequent electrical connection with a chip. Each circuit line 14 is also connected to a bonding pad 16 and a ball pad 18. Each bonding pad 16 is an area where the end of a conductive wire is bonded using a wire-bonding machine and each ball pad 18 is an area where a solder ball is attached. A solder mask 20 is formed over the substrate board 10 such that the bonding pads 16 and the ball pads 18 are exposed. In general, copper is used to form the circuit lines 14. However, the surface of a copper layer can be easily oxidized to form a poor conductive layer. Therefore, to increase bondability of each bonding pads 16 with a conductive wire during a wire-bonding operation and each solder ball with a ball pad 18, a layer of gold is usually plated on top.

To facilitate the electroplating of a gold film over the bonding pads 16 and the ball pads 18, additional electroplating bars 22 are formed on the substrate board 10 connecting to all circuit lines 14. After the electroplating bars 22 are appropriately connected to an electrode, electroplating gold can be carried out. However, before carrying out an open/short test (O/S test), electrical connections between the circuit lines 14 must be severed. To maintain substrate board integrity so that subsequent testing and packaging can be conveniently carried out, junctions between the circuit lines 14 and the electroplating bars 22 have to be cut by performing multiple half drillings. The process is laborious and time-consuming. In addition, the electroplating bars are positioned along the peripheral section of a substrate board. Hence, the required board area is increased, leading to a waste of board material.

FIG. 2 is a schematic top view of another conventional substrate board. As shown in FIG. 2, the electroplating bar 22 is different from the one in FIG. 1. The electroplating bar 22 is located in the middle of the slot region 11. The slot 11 is only made after the electroplating operation. In the slot-making process, electrical connections between the electroplating bar 22 and the circuit lines 14 are cut. FIG. 3 is a magnified view of the area surrounding the slot 11 in FIG. 2. As shown in FIG. 3, when the electroplating bar 22 is formed in the middle of the slot region, burrs 24 are likely to form on the edges of the cut surfaces. Hence, some of the circuit lines 14 may be short-circuited leading to poor product quality.

SUMMARY OF THE INVENTION

The present invention provides a substrate board structure capable of preventing burrs from forming around the slot of the board and hence improving the board quality.

The invention provides a substrate board having an electroplating bar inside a slot region of the board such that electrical connections between circuit lines and the electroplating bar can be severed when the board is cut to form a slot.

To achieve these and other advantages and in accordance with the purpose of the invention, as embodied and broadly described herein, the invention provides a substrate board structure. The substrate board is formed by stacking a plurality of circuit layers and insulation layers on top of each other. Each circuit layer has a plurality of circuit lines and every pair of neighboring circuit layers is isolated from each other by an insulation layer. The insulation layers further include a plurality of vias for connecting electrically with circuit line layers. The interior surface of each via is electroplated with a metal film and the remaining interior space of the vias is filled with a filler material. The substrate board further includes a central slot. The circuit layer on the substrate board surface has a plurality of first contact points and second contact points that are connected to various circuit lines. The first contact points are close to the slot. Circuit lines that connect to the first contact points extend forward to reach the vias along the edge of the slot. Since the vias are formed on the boundary of the slot region, a portion of the metallic film within the vias is exposed.

To form the substrate board structure of this invention, a substrate board comprising of a plurality of insulation layers and circuit layers stacked on top of each other is provided. Neighboring circuit layers are separated by an insulation layer. The substrate board has a slot region. Holes are drilled to form a plurality of vias on the substrate board. A few of the vias are formed in the boundary of the slot region. The interior surface of the vias is electroplated to form a metal film. The remaining space inside the vias is filled with a filler material. The circuit layer on a substrate board surface is patterned to form a plurality of circuit lines. Each circuit line on the board surface is also connected to a first contact point, a second contact point and an electroplating bar. The first contact points are closer to the slot region. The electroplating bar is inside the slot region. The circuit line that connects to a first contact point extends to a via on the boundary of the slot region and continues on to reach the electroplating bar. The electroplating bar is connected to an electrode and then the circuit lines are electroplated so that the surfaces of the first contact points and the second contact points are electroplated. Finally, a slot is formed by cutting out a piece in the slot region so that a portion of the metal film on the via sidewall is exposed.

Since the metallic film on the via sidewall is sandwiched between the filler material and the insulation layer alone a radius, burrs are less likely to form when the board is cut. Moreover, the severance of electrical connection between the circuit lines and the electroplating bar as well as the cutting of substrate boards to form a slot can be achieved in the same step.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
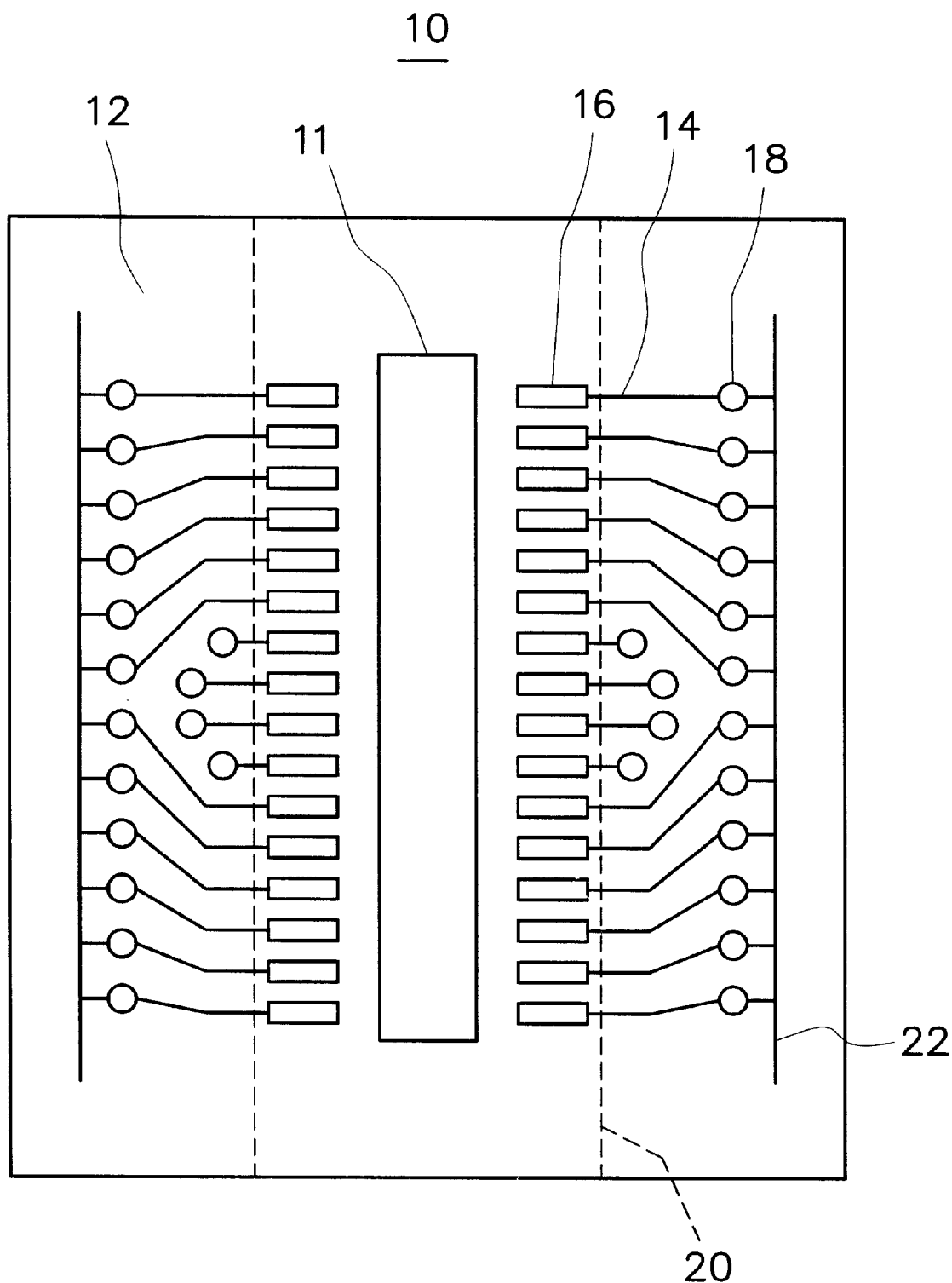
FIG. 1 is a schematic top view showing a conventional LOC substrate board.
Figure 2:
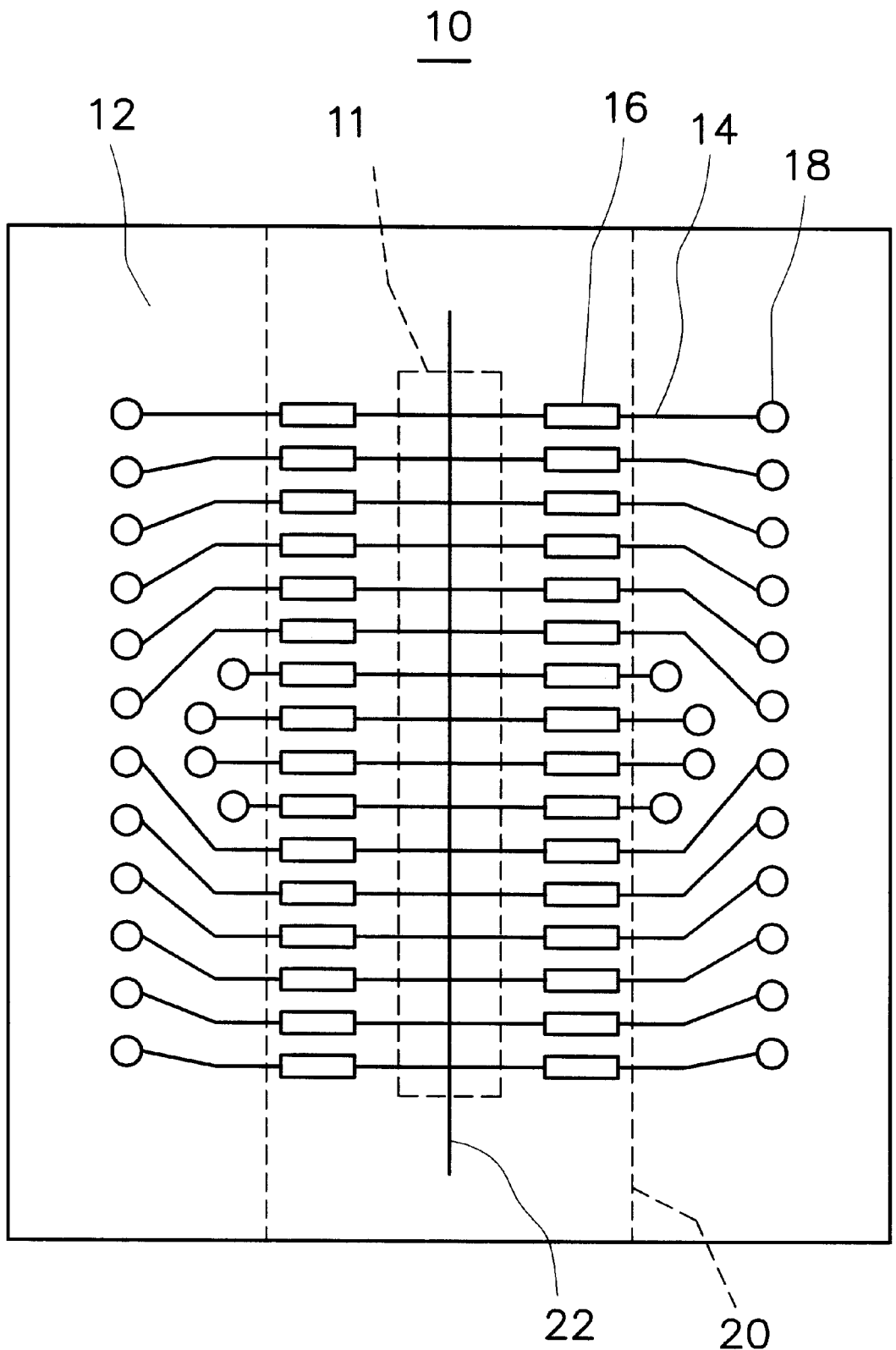
FIG. 2 is a schematic top view of another conventional LOC substrate board.
Figure 3:
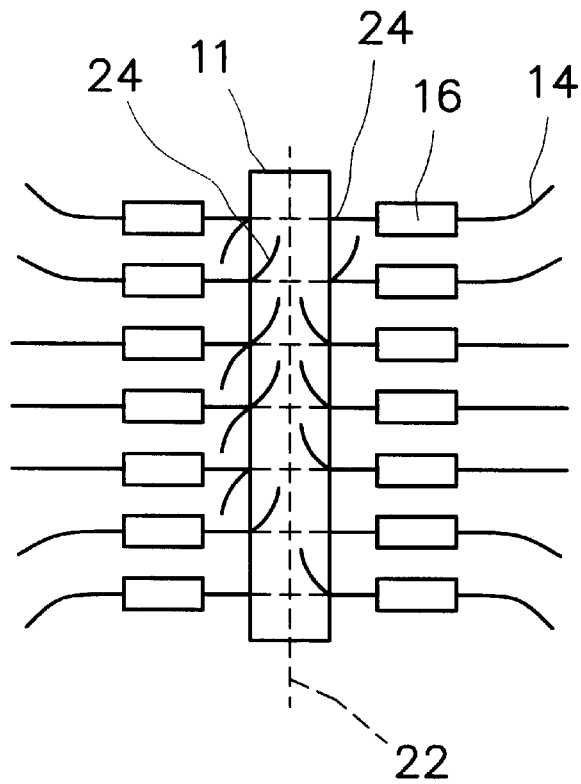
FIG. 3 is a magnified view of the area surrounding the slot in FIG. 2.

Reference will flow be made in detail to the present preferred embodiments of the invention, examples of which are illustrated in the accompanying drawings. Wherever possible, the same reference numbers are used in the drawings and the description to refer to the same or like parts.

Figure 4:
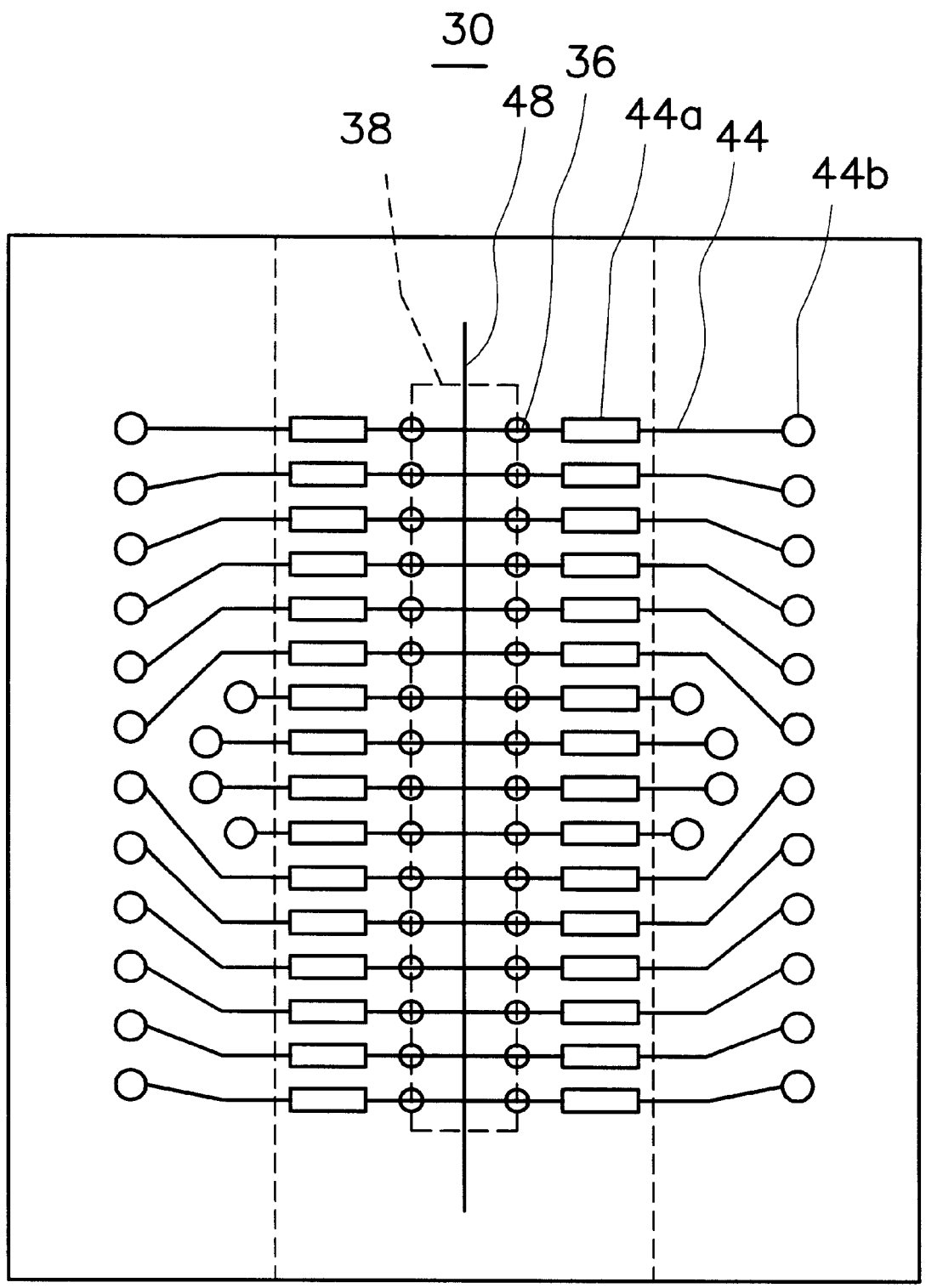
FIG. 4 is a schematic top view showing a substrate board structure fabricated according to one preferred embodiment of this invention.

FIG. 4 is a schematic top view showing a substrate board structure fabricated according to one preferred embodiment of this invention. FIGS. 5A through 5E are schematic, cross-sectional views showing the progression of manufacturing steps for producing a substrate board according to one preferred embodiment of this invention. As shown in FIG. 4 and FIGS. 5A through 5E, the LOC substrate board 30 comprises a top circuit layer 32a, an insulation layer 34 and a bottom circuit layer 32b. The circuit layers 32a and 32b are made from metallic films such as copper films. The insulation layer 34 is made from a material such as glass epoxy resins (FR-4 or FR-5) or bismaleimide-triazine (BT).

Figure 5A:
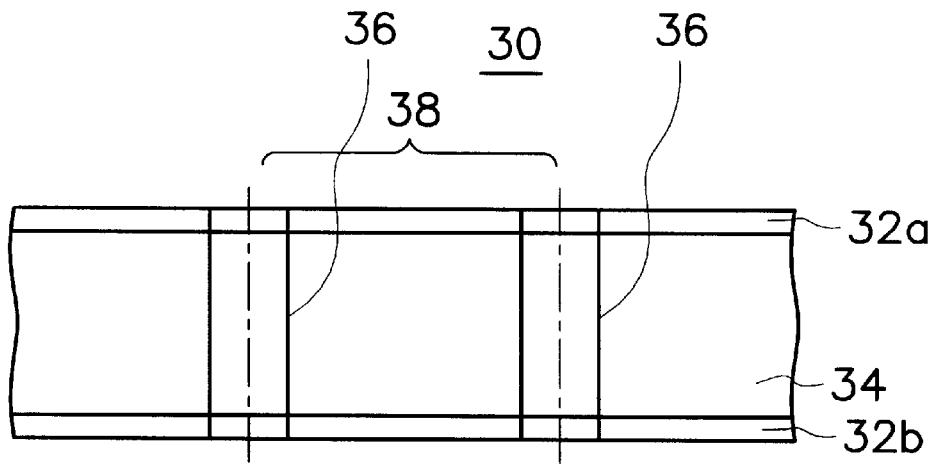
FIGS. 5A through 5E are schematic cross-sectional views showing the progression of manufacturing steps for producing a substrate board according to one preferred embodiment of this invention.
Figure 5B:
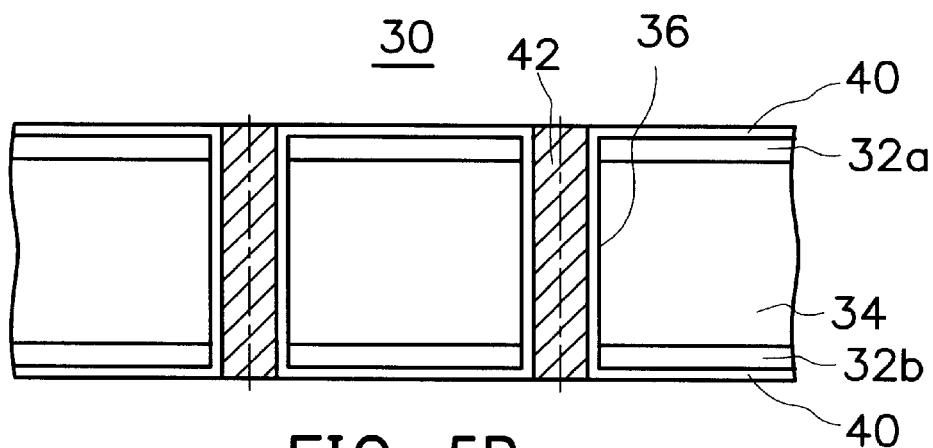

The substrate board 30 is drilled to form a plurality of vias 36 as shown in FIG. 5A, Some of the vias 36 are formed along the boundary of a slot region 38. A thin metallic film 40, for example, a copper film is formed on the interior surface of the vias and the top surface of the circuit layers 32a and 32b by electroplating as shown in FIG. 5B. A filler material 42 is used to fill the remaining space inside the vias 36. In other words, the metallic film on the interior surface of the vias 36 is sealed off by an insulation material such as a hole-filling paint.

Figure 5C:
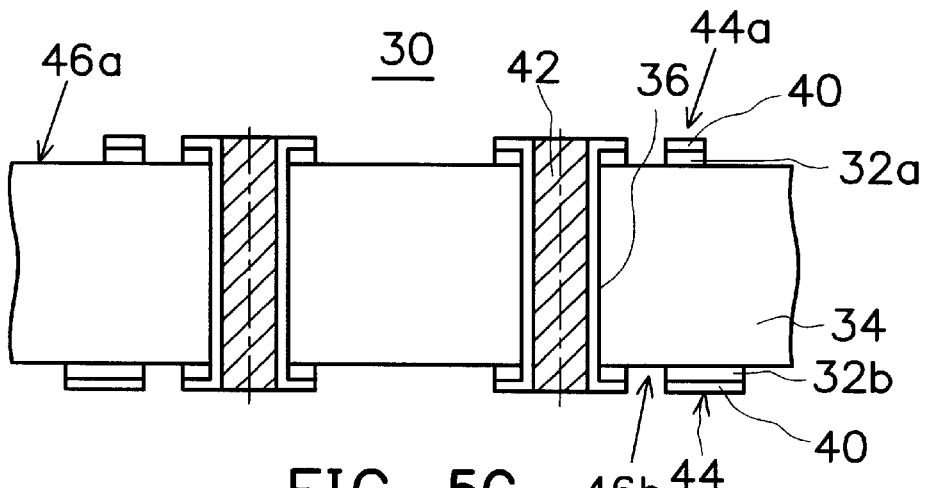

As shown in FIG. 5C, the circuit layers 32a and 32b and the metallic film 40 are patterned to form circuit lines 44 by performing photolithographic and etching processes. Circuit lines 44 on a first surface 46a of the substrate board 30 are each connected to a bonding pad 44a (a first contact point) and a ball pad 44b (a second contact point). On the other hand, only ordinary circuit lines 44 are formed on a second surface 46b of the substrate board 30. However, circuit lines 44 that are connected with the bonding pads 44a also extend forward to reach the vias 36 along the edge of the slot region 38. From the vias 36, the circuit lines 44 also extend forward to reach an electroplating bar 48 inside the slot region 38 (shown in FIG. 4).

Figure 5D:
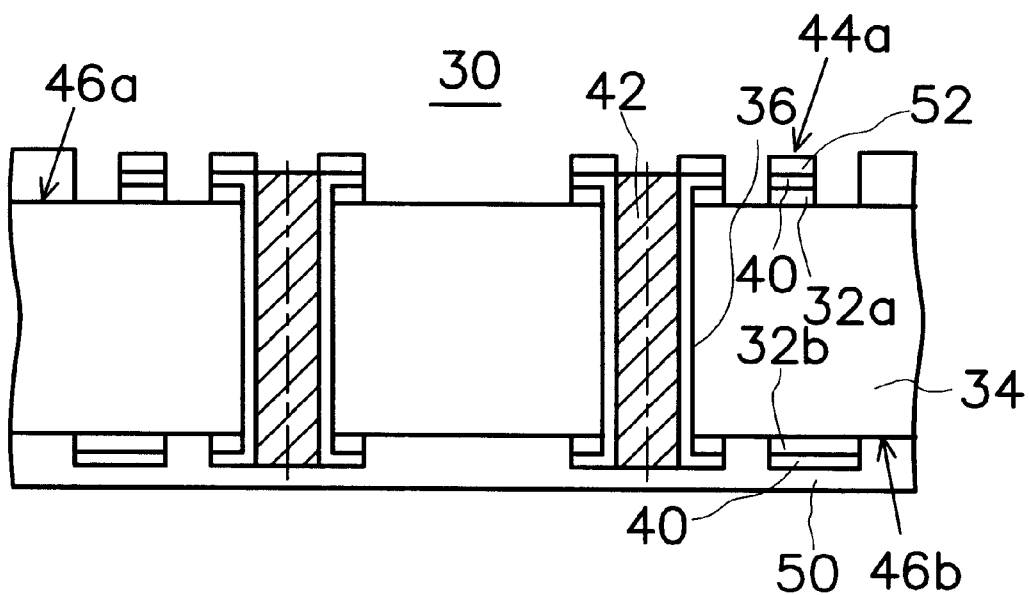

A solder mask layer is formed over the surface 46a. The solder mask layer is patterned to form a solder mask pattern 50 that exposes only the bonding pads 44a and the ball pads 44b as shown in FIG. 5D. Similarly, a solder mask layer is also formed over the second surface 46b of the substrate board 30. However, the entire surface 46b is covered by the solder mask layer. In general, the solder mask 50 is formed by two methods, including:

1. An ultraviolet method that includes the steps of coating, first baking, UV exposure, resist developing, UV curing and second baking. Ultimately, only a portion of the substrate board surface is covered by the solder mask.

2. A hot baking method employs a screen-printing operation to form a solder mask layer over a portion of the substrate board surface followed by baking to dry and harden the layer.

The electroplating bar 48 is next connected to an electrode (not shown in the figure) so that electroplating can be carried out. After electroplating, a metallic film 52 is formed over the exposed surface of the bonding pads 44a and the ball pads 44b. The metallic film 52 is preferably made of nickel and gold. The purpose of having a metallic film over the bonding pads 44a and the ball pads 44b is to prevent the oxidation of exposed copper surfaces. Another reason for plating on an additional metallic layer is to increase the bondability of the bonding pads 44a and the ball pads 44b with conductive wires.

Figure 5E:
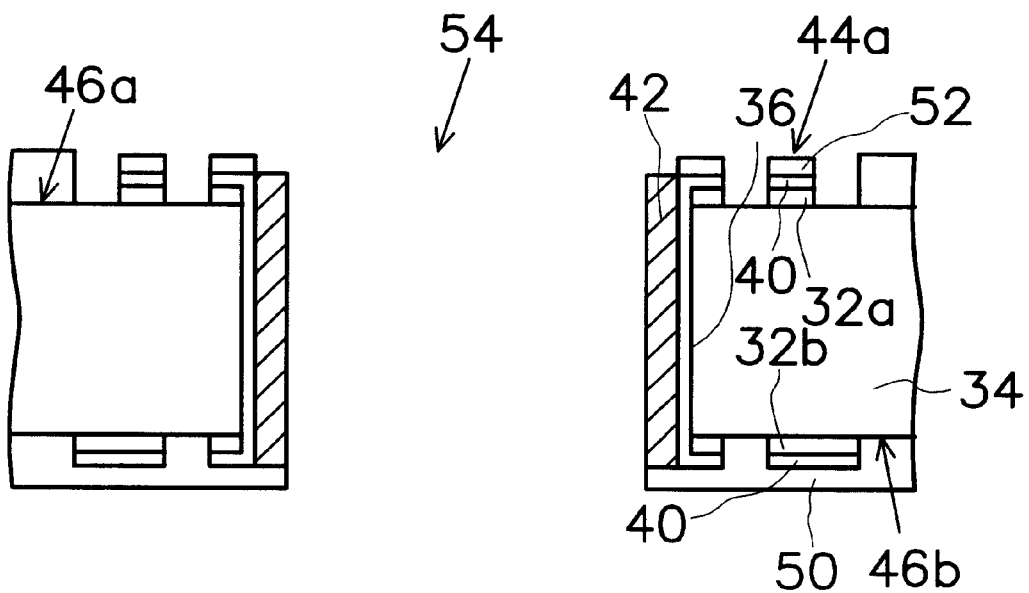

A portion of the substrate board 30 in the slot region 38 is removed by cutting, thereby forming a slot 54 as shown in FIG. 5E. In the process of cutting the substrate board 30 to form the slot 54, any connections from the circuit lines 44 to the electroplating bar 48 are severed so that the circuit lines 44 are no longer electrically connected.

Figure 6:
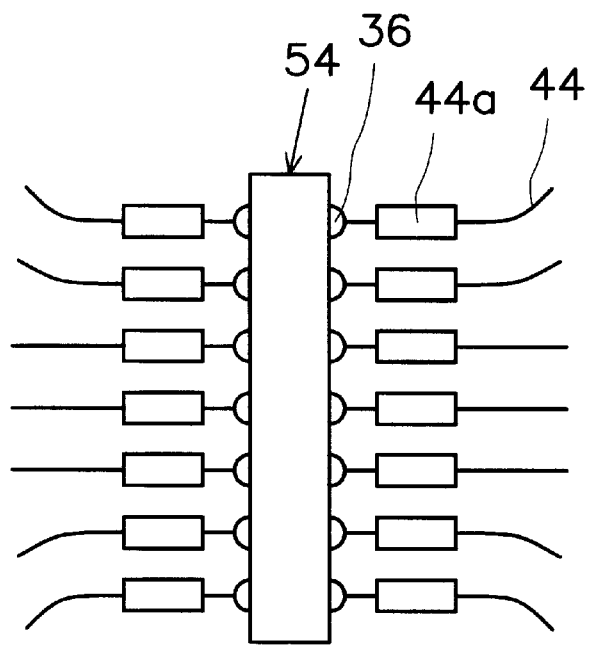
FIG. 6 is a magnified view of the area surrounding the slot in FIG. 4.

FIG. 6 is a magnified view of the area surrounding the slot in FIG. 4. As shown in FIG. 6, each circuit line 44 reaches a via 36 at the edge of the slot 54 after passing through a bonding pad 44a. A portion of the via 36 is removed during the slot-forming process so that a portion of the metallic film 40 is exposed. Since the metallic film 40 is sandwiched between the filler material 42 and the insulation layer 34 along a radius, burrs are less likely to form on the cut surface when the slot 54 is formed.

Figure 7:
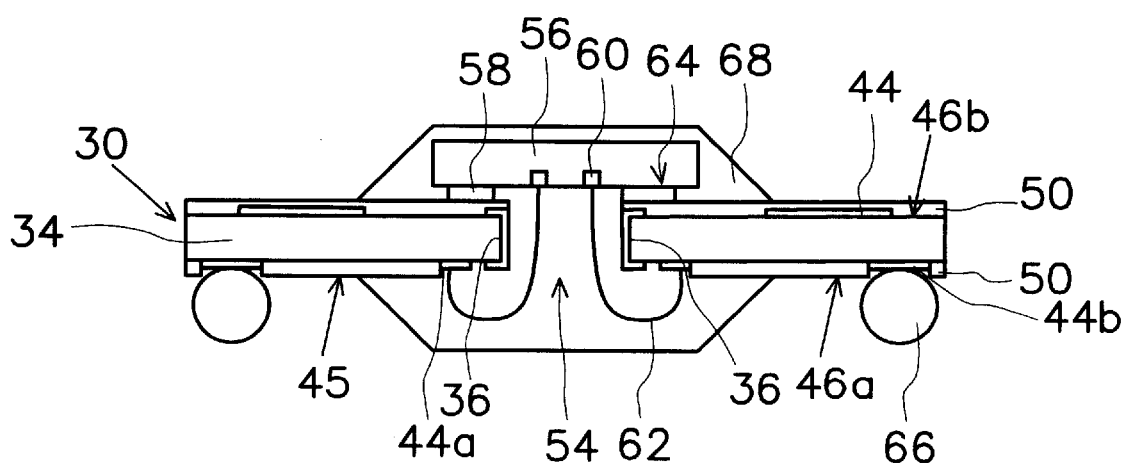
FIG. 7 is a schematic cross-sectional view showing a semiconductor package fabricated using a LOC substrate board of this invention.

FIG. 7 is a schematic, cross-sectional view showing a semiconductor package fabricated using a LOC substrate board of this invention. A substrate board 30 identical to the one shown in FIG. 5E is provided. A silicon chip 56 is attached to the surface 46b using elastomer tape 58. The silicon chip 56 has a plurality of bonding pads 60 on the surface 64 on the same side as the surface attached to the substrate board 30. The bonding pads 60 are exposed by the slot 54. A wire-bonding operation is carried out using conductive wires 62 to connect the bonding pads 60 with the bonding pads 44a. The conductive wires 62 can be, for example, gold wires, aluminum wires or copper wires. The silicon chip 56, the conductive wires 62 and the points of connection between the conductive wires 56 and the bonding pads 44a are enclosed by a packaging material 68. The packaging material 68 can be a resin or a liquid-form compound. A solder ball 66 is next attached to each of the ball pads 44b. The solder balls 66 can be made from a lead-tin alloy.

Although a two-circuit-layer design is chosen to illustrate the aforementioned embodiment of this invention, a multi-circuit-layer design such as a four-circuit-layer or six-circuit-layer design is possible. Furthermore, besides a LOC semiconductor package, the substrate board structure of this invention can also be applied to other types of substrate board. Since burrs appear at a cut out surface due to a lack of protection by a solder mask, the invention can be applied to substrate board that requires cutting without a solder mask. For example, the invention can be used to prevent the formation of burrs when the substrate board of a light emitting diode (LED) is cut.

In summary, the substrate board structure of this invention is able to prevent the formation of burrs and improve the yield of the semiconductor package. The vias along the edge of the slot are formed at the same time as other vias. Therefore, no additional processing step is required. Moreover, the design of this invention permits the relocation of the electroplating bar to the central slot region. Hence, substrate board surface is reduced and connections between the circuit lines and the electroplating bar are severed when the slot is formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate board structure for packaging a silicon chip that has a plurality of bonding pads, comprising:
   a plurality of circuit layers, wherein each of the circuit layer has a plurality of circuit lines; and
   an insulation layer between each pair of neighboring circuit layers, wherein the insulation layer further includes a plurality of vias for electrically connecting the circuit layers, an interior surface of each via has an electroplated metallic film, and a remaining interior space of the vias is filled with a filler material; wherein
   the substrate board is formed by joining a circuit layer and an insulation layer alternately and cutting a portion of the substrate board to form a slot, wherein the circuit layer on the substrate board surface further includes circuit lines that are connected to a plurality of first contact points and a plurality of second contact points, the first contact points are closer to the slot, the circuit line that connects to the first contact point extends forward to reach a via, and the vias are positioned along the edge of the slot so that a portion of the metallic film inside the via is exposed through the cut surface of the slot.

2. The substrate board structure of claim 1, wherein the board further includes a solder mask layer that covers a portion of the board surface while exposing the first contact points and the second contact points.

3. The substrate board structure of claim 1, wherein the first contact points serve as a medium for electrically connecting with the bonding pads on the silicon chip.

4. The substrate board structure of claim 1, wherein a solder ball is attached to each of the second contact points.

5. The substrate board structure of claim 1, wherein surfaces of the first contact points and the second contact points are covered by electroplated metallic films.

6. The substrate board structure of claim 5, wherein the electroplated metallic films on the first and the second contact points include gold films.

7. The substrate board structure of claim 1, wherein a material for forming the circuit layer and the metallic film includes copper.

8. A semiconductor package, comprising:
   a substrate board, comprising:
      a plurality of circuit layers, wherein each of the circuit layer contains a plurality of circuit lines; and
      an insulation layer between each pair of neighboring circuit layers, wherein the insulation layer has a plurality of vias for electrically connecting the circuit layers, the interior sidewalls of each via have an electroplated metallic film, and a remaining interior space of the vias are filled with a filler material; wherein
         the substrate board is formed by joining a circuit layer and an insulation layer alternately and cutting a portion of the substrate board to form a slot, wherein the circuit layer on the substrate board surface has circuit lines that are connected to a plurality of first contact points and a plurality of second contact points, the first contact points are closer to the slot, the circuit line that connects to the first contact point extends forward to reach a via, and the vias are positioned along the edge of the slot so that a portion of the metallic film inside the via is exposed through the cut surface of the slot;
   a silicon chip attached to a substrate board surface, wherein a surface of the silicon chip contacting the substrate board has a plurality of bonding pads over the slot;
   a plurality of conductive wires for electrically connecting the bonding pads on the silicon chip with the first contact points; and
   a packaging material that at least encloses the conductive wires and the first contact points.

9. The package of claim 8, wherein the substrate board further includes a solder mask layer that covers a portion of the substrate board surface while exposing the first contact points and the second contact points.

10. The package of claim 8, wherein a solder ball is attached to each of the second contact points.

11. A method for forming a substrate board, comprising the steps of:
   providing a substrate board, wherein the substrate board is formed by stacking a plurality of circuit layers with an insulation layer between every pair of neighboring circuit layers, and the substrate board also has a slot region;
   drilling to form a plurality of vias on the substrate board, wherein some of the vias are formed along a boundary of the slot region;
   plating to form a metallic film over an interior surface of the vias;
   filling a remaining space inside the via with a filler material;
   patterning the circuit layer on a surface of the substrate board, wherein the circuit lines are connected to a plurality of first contact points, a plurality of second contact points and an electroplating bar, the first contact points are formed close to the slot region while the electroplating bar is formed within the slot region, and circuit lines that are connected to the first contact points extend forward to reach the vias at the boundary of the slot region and continue on to reach the electroplating bar;
   forming electroplated metallic films over the surfaces of the first contact points and the second contact points by connecting the electroplating bar to an electrode and performing an electroplating operation; and cutting out the substrate board inside the slot region to form a slot so that a portion of the metallic film inside the vias along an edge of the slot is exposed.

12. The method of claim 11, wherein after the step of patterning the circuit layer on the substrate board surface, further includes forming a solder mask layer over the board surface such that the first contact points, the second contact points and the electroplating bar are all exposed.

13. The method of claim 11, wherein a material for forming the circuit lines and the metallic film over the interior surface of the vias includes copper.

14. The method of claim 11, wherein a material for forming the electroplated metallic films over the first and second contact points includes gold.

* * * * *